US008053268B2

(12) United States Patent
Otsuka et al.

(10) Patent No.: US 8,053,268 B2
(45) Date of Patent: Nov. 8, 2011

(54) SEMICONDUCTOR DEVICE AND METHOD OF MANUFACTURING THE SAME

(75) Inventors: Mari Otsuka, Yokohama (JP); Hiroyuki Kamijiyo, Sagamihara (JP); Hideaki Harakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/259,732

(22) Filed: Oct. 28, 2008

(65) Prior Publication Data

US 2009/0108388 A1 Apr. 30, 2009

(30) Foreign Application Priority Data

Oct. 29, 2007 (JP) ................................. 2007-280304

(51) Int. Cl.
*H01L 21/00* (2006.01)
(52) U.S. Cl. .................. 438/57; 257/E21.002
(58) Field of Classification Search .................. 257/414, 257/428, 431–466, E21.001, E21.002; 438/48, 438/57–98, 758, 778, 783
See application file for complete search history.

(56) References Cited

U.S. PATENT DOCUMENTS

| 4,962,065 A * | 10/1990 | Brown et al. ................. 438/792 |
| 7,342,268 B2 | 3/2008 | Adkisson et al. |
| 2004/0251395 A1* | 12/2004 | Takahashi et al. ......... 250/208.1 |
| 2006/0220025 A1 | 10/2006 | Oh |
| 2007/0077777 A1* | 4/2007 | Gumpher ..................... 438/778 |
| 2007/0145419 A1 | 6/2007 | Park |
| 2007/0194396 A1 | 8/2007 | Nomura |
| 2008/0036023 A1 | 2/2008 | Park |

FOREIGN PATENT DOCUMENTS

| CN | 1992212 A | 7/2007 |
| CN | 101026173 A | 8/2007 |
| EP | 1814155 A1 * | 8/2007 |
| JP | 5-29598 | 2/1993 |
| JP | 2001-136341 | 5/2001 |
| JP | 2005-311015 | 11/2005 |
| JP | 2006-179903 | 7/2006 |
| JP | 2006-229206 | 8/2006 |
| JP | 2006-269963 | 10/2006 |

OTHER PUBLICATIONS

Notification of the Second Office Action issued by the State Intellectual Property Ofice of the People's Republic of China on Aug. 4, 2010, for Chinese Patent Application No. 200810173822.4, and English-language translation thereof.
Ay et al., "Comparative investigation of hydrogen bonding in silicon based PECVD grown dielectrics for optical waveguides," Optical Materials (2004), 26:7-20.
Notification of the First Office Action issued by the Chinese Patent Office on Jan. 8, 2010, for Chinese Patent Application No. 200810173822.4, and English-language translation thereof.

(Continued)

*Primary Examiner* — Ha Tran T Nguyen
*Assistant Examiner* — Kevin Quinto
(74) *Attorney, Agent, or Firm* — Finnegan, Henderson, Farabow, Garrett & Dunner, L.L.P.

(57) ABSTRACT

A semiconductor device has a semiconductor substrate including a light receiving element, a silicon oxide film formed on the semiconductor substrate, a plurality of wiring interlayer films formed on the silicon oxide film, and each including a wiring layer formed as the result of the fact that copper is buried, and a silicon nitride film formed on the wiring interlayer film of the uppermost layer wherein Si—H concentration is smaller than N—H concentration.

7 Claims, 12 Drawing Sheets

OTHER PUBLICATIONS

Martinez et al., "Bonding structure and hydrogen content in silicon nitride thin films deposited by the electron cyclotron resonance plasma method," Elsevier (2004), pp. 203-207.

English-language translation of Notification of the Third Office Action issued by the State Intellectual Property Ofice of the People's Republic of China on Nov. 11, 2010, for Chinese Patent Application No. 200810173822.4.

Notification of Reasons for Rejection issued by the Japanese Patent Office on Feb. 22, 2011, for Japanese Patent Application No. 2007-280304, and English-language translation thereof.

* cited by examiner

SEMICONDUCTOR DEVICE AND METHOD OF MANUFACTURING THE SAME

CROSS REFERENCE TO RELATED APPLICATION

This application is based upon and claims benefit of priority from the Japanese Patent Application No. 2007-280304, filed on Oct. 29, 2007, the entire contents of which are incorporated herein by reference.

BACKGROUND OF THE INVENTION

The present invention relates to a semiconductor device and a method of manufacturing the same.

Miniaturization of semiconductor devices including solid-state image pickup device such as CCD image sensor or CMOS image sensor is required. Followed by this, a light receiving area including microlens and light receiving element (photodiode), and a peripheral circuit area including plural layers for performing read-out operation, etc. of photoelectrically converted signal electrons are formed in one-chip.

In the case where interlayer insulating films of the light receiving area and the peripheral circuit area are formed by the same film structure, there was the problem that the distance between the microlens and the light receiving element is elongated, and an unnecessary layer or layers exist on the light receiving element so that quantity of light attenuation takes place, and the sensitivity at the light receiving element is thus lowered.

In order to solve such a problem, there is proposed an image sensor in which plural interlayer insulating films of active pixel area on the light receiving element are removed so that the distance between the lens and the light conversion element is caused to be shorter than the distance from the uppermost part of the interlayer insulating film formed on the peripheral circuit area to the substrate.

However, such image sensor has the problem that planarization film having high water permeability is only provided below the lens, but passivation film is not formed. For this reason, there is the problem that resistance with respect to water or stress from the outside is low so that the reliability is lowered.

SUMMARY OF THE INVENTION

According to one aspect of the present invention, there is provided a semiconductor device comprising:

a semiconductor substrate including a light receiving element;

a silicon oxide film formed on the semiconductor substrate;

a plurality of wiring interlayer films formed on the silicon oxide film, and each including a wiring layer formed as the result of the fact that copper is buried; and a silicon nitride film formed on the wiring interlayer film of the uppermost layer wherein Si—H concentration is smaller than N—H concentration.

According to one aspect of the present invention, there is provided a method of manufacturing a semiconductor device, comprising:

forming a light receiving element at a surface part of a semiconductor substrate;

forming, on the semiconductor substrate, a plurality of wiring interlayer films each including a wiring layer formed as the result of the fact that copper is buried;

forming, on the wiring interlayer film of the uppermost layer, a first silicon nitride film in which Si—H concentration is smaller than N—H concentration;

forming, at a peripheral circuit part, a contact plug in contact with the wiring layer included in the wiring interlayer film of the uppermost layer, and a wiring in contact with the contact plug;

forming an interlayer insulating film in a manner to cover the wiring;

removing the interlayer insulating film at an upper part of the light receiving element; and forming, at an upper part of the light receiving element, a second silicon nitride film in which Si—H concentration is smaller than N—H concentration.

According to one aspect of the present invention, there is provided a method of manufacturing semiconductor device, comprising:

forming a light receiving element at a surface part of a semiconductor substrate;

forming, on the semiconductor substrate, a plurality of wiring interlayer films each including a wiring layer formed as the result of the fact that copper is buried;

forming, on the wiring interlayer film of the uppermost layer, a silicon nitride film in which Si—H concentration is smaller than N—H concentration;

forming a planarization film within at least an upper area of the light receiving element on the silicon nitride film;

forming a color filter on the planarization film; and forming a microlens on the color filter.

DESCRIPTION OF THE EMBODIMENTS

Embodiments of the present invention will now be described with reference to the attached drawings.

Figure 1:
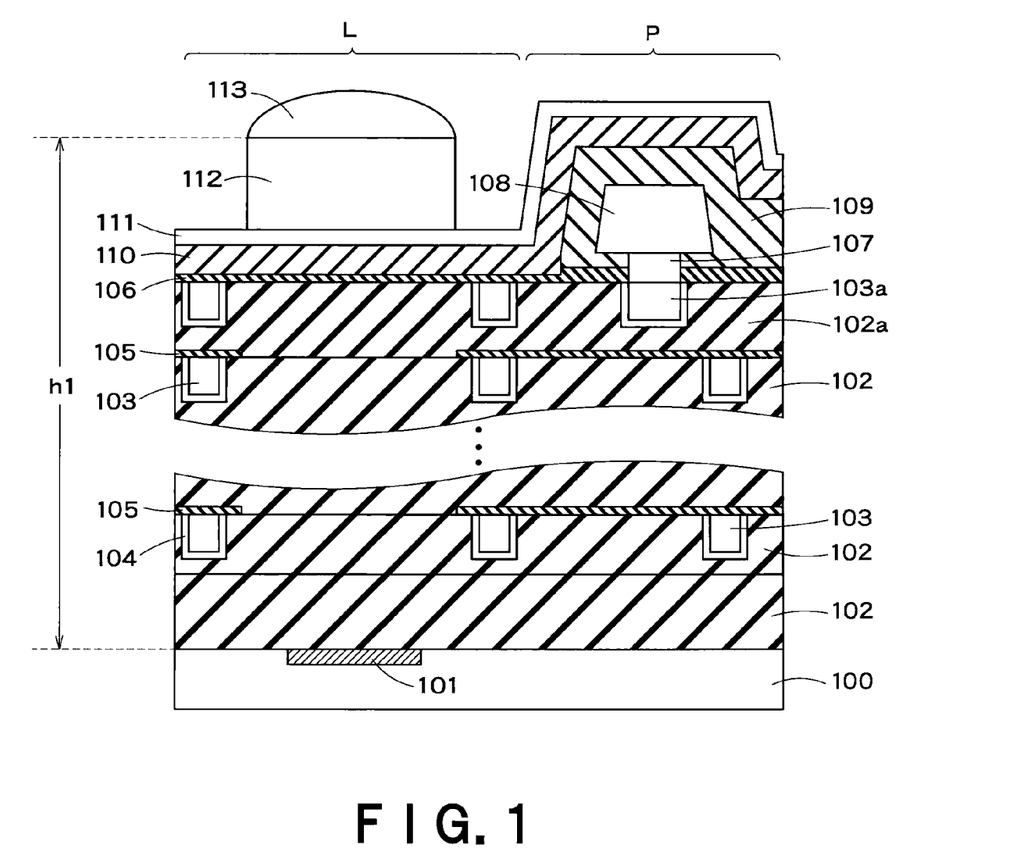
FIG. 1 is a view illustrating the outline of the configuration of a semiconductor device according to an embodiment of the present invention.

The outline of the configuration of a semiconductor device according to an embodiment of the present invention is shown in FIG. 1. At the surface part of a silicon substrate 100, a photodiode (light receiving element) 101 for performing photoelectric conversion is formed. Although single photodiode is only illustrated, plural photodiodes are two-dimensionally formed, e.g., in an array form in practice.

Plural interlayer insulating films 102 are formed on the silicon substrate 100. The interlayer insulating film 102 is, e.g., silicon oxide film. Wiring layers 103 are formed within the interlayer insulating films 102, and each barrier metal 104 is formed in a manner to cover the side part and the bottom part of the wiring layer 103. Moreover, a diffusion prevention film 105 is formed on the wiring layer 103.

The wiring layer 103 is formed of copper, and the barrier metal 104 and the diffusion prevention film 105 serve to prevent copper from being diffused into the interlayer insulating film 102. The barrier metal 104 is, e.g., tantalum and nitride tantalum, and the diffusion prevention film 105 is silicon nitride film.

On an interlayer insulating film 102a and wiring layers 103a of the uppermost layer, a silicon nitride film 106 serving as a diffusion prevention film is formed.

At a peripheral circuit part P, a wiring layer 108 electrically connected to the wiring layer 103a through a contact plug 107 is formed, and an interlayer insulating film 109 is formed in a manner to cover the contact plug 107 and the wiring layer 108. The wiring layer 108 is formed, for example, of aluminum.

A silicon nitride film 110 is formed in a manner to cover the interlayer insulating film 109 and the diffusion prevention film 106 of light receiving area L, and a planarization film 111 is formed on the silicon nitride film 110. The planarization film 111 is a transparent resin-like substance.

In the light receiving area L, a color filter 112 and a microlens 113 are formed on the planarization film 111.

The microlens 113 serves to form an image of a light which has been emitted from an object to be imaged on a light receiving plane surface of the photodiode 101. The color filter 112 serves to allow a light having a specific wavelength to be transmitted therethrough, wherein three colors of e.g., R (Red), G (Green) and B (Blue) form one set.

A light which has been passed through the microlens 113 and the color filter 112 is received by photodiode 101 through planarization film 111, silicon nitride films 110, 106 and plural interlayer insulating films 102. The light which has been received by the photodiode 101 is caused to undergo photoelectric conversion. Thus, charges corresponding thereto are taken out.

Figure 2:
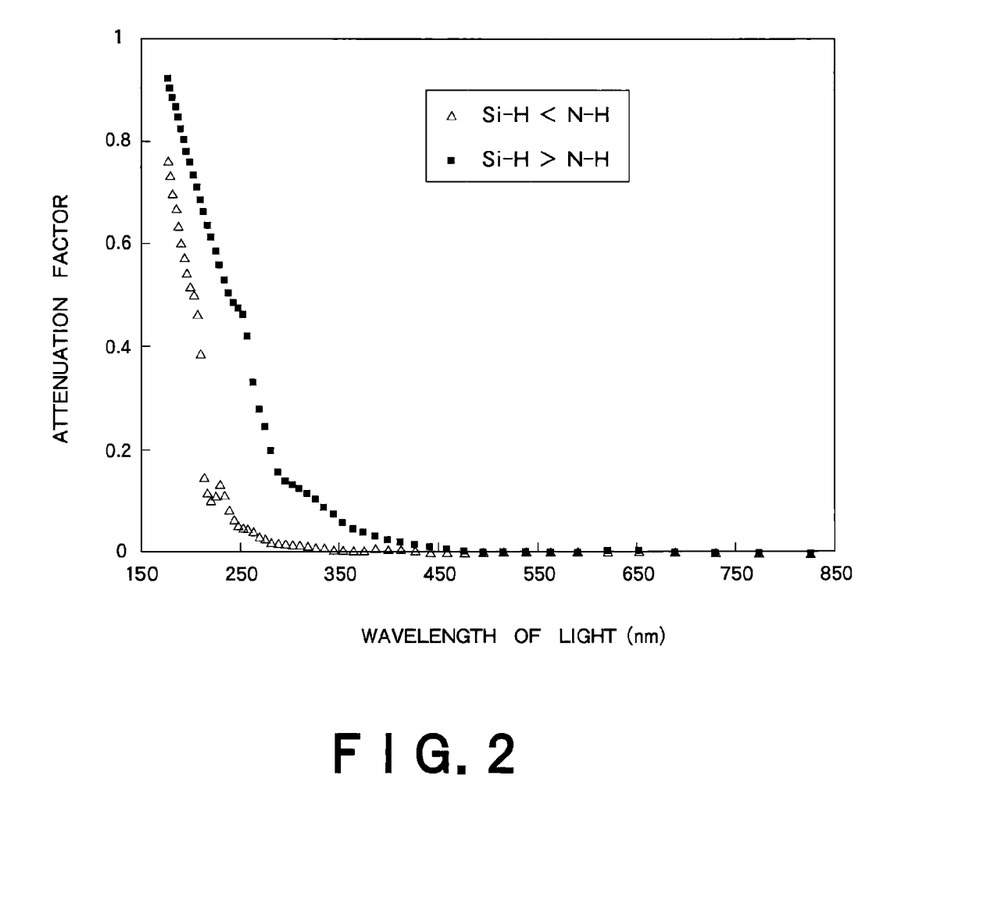
FIG. 2 is a graph showing the relationship between wavelength and attenuation factor of transmitted light of silicon nitride film.

FIG. 2 is a graph showing the relationship between wavelength and attenuation factor of a light passed through the silicon nitride film. The results with respect to two kinds of silicon nitride films in which concentration of Si—H bond and concentration of N—H bond which are included in the silicon nitride film are changed are plotted.

The results with respect to the silicon nitride film in which Si—H concentration is larger than N—H concentration are plotted by square marker, and results with respect to the silicon nitride film in which Si—H concentration is smaller than N—H concentration are plotted by triangular marker.

From FIG. 2, it is understood that attenuation factor of silicon nitride film in which Si—H concentration is smaller than N—H concentration has smaller attenuation factor. In general, the optical wavelength region used in the image sensor is 350 nm to 750 nm, and attenuation factor in this wavelength region of silicon nitride film in which Si—H concentration is smaller than N—H concentration can be extremely reduced to substantially 0.

Accordingly, the Si—H concentration and N—H concentration which are included in the silicon nitride films 110, 106 are caused to have the relation expressed as Si—H concentration <N—H concentration, thereby making it possible to suppress attenuation of light. Thus, reduction of received light quantity at the photodiode 101 can be suppressed.

Moreover, since no interlayer insulating film 109 is formed in the light receiving area L, the distance between microlens 113 and photodiode 101 (distance h1 in FIG. 1) can be shortened. Thus, the sensitivity at the photodiode 101 can be improved.

Further, the silicon nitride films 110 and 106 have excellent water proof characteristic, and thus can perform the function as the passivation film.

As stated above, the semiconductor device according to this embodiment can prevent lowering of sensitivity at a light receiving element, and includes passivation film below the microlens thus to have ability to improve the reliability.

Figure 3:
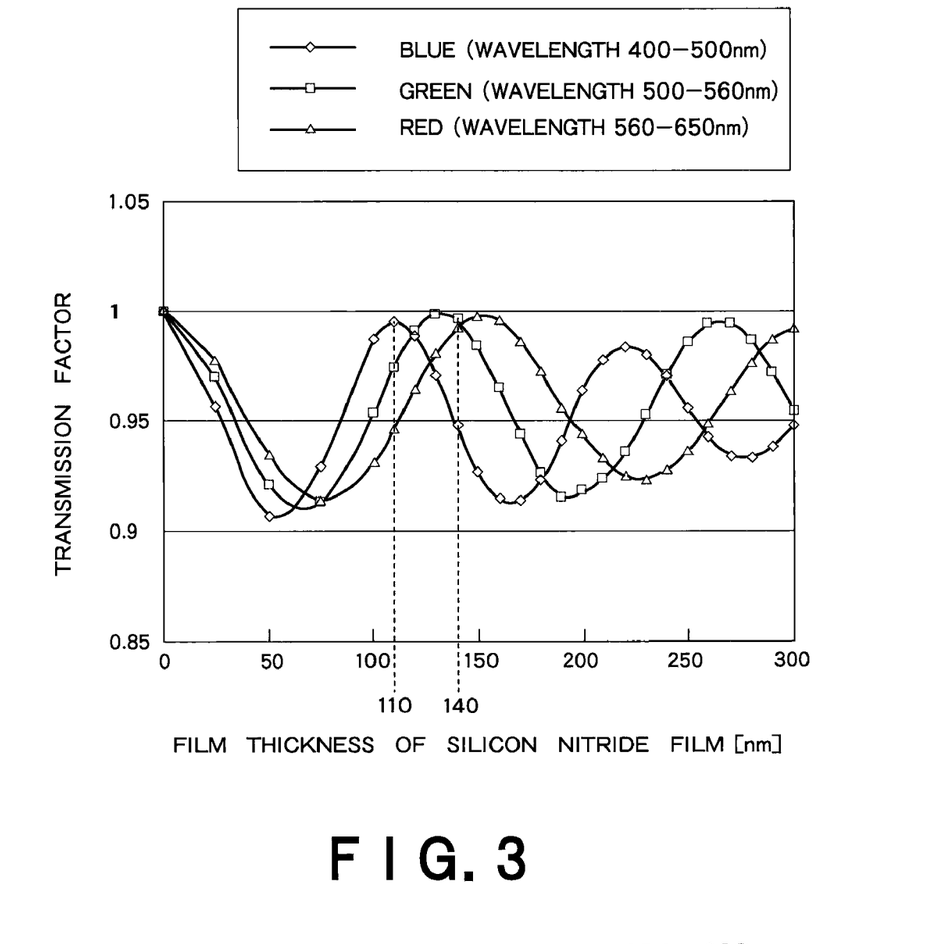
FIG. 3 is a graph showing the relationship between film thickness of silicon nitride film and transmission factor of transmitted light.

The graph indicating the relationship between film thickness of silicon nitride film and transmission factors of rays of light of respective colors of red, green and blue is shown in FIG. 3. Blue light is plotted by using rhombus-shaped marker, green light is plotted by using square marker and red light is plotted by triangular marker. From this graph, it is understood that the transmission factor of light changes depending upon film thickness of silicon nitride film. Namely, the film thickness of the silicon nitride film is adjusted, thereby making it possible to suppress attenuation of an incident light.

From FIG. 3, it is understood that transmission factors of rays of light of respective colors of red, green and blue are high within the range where the film thickness of silicon nitride film is 110 nm to 140 nm.

Accordingly, the total film thickness of silicon nitride films 110, 106 in the semiconductor device according to the above-mentioned embodiment is caused to fall within the range from 110 nm to 140 nm, thereby making it possible to further suppress attenuation of an incident light (lowering of sensitivity at light receiving element).

A method of manufacturing such a semiconductor device will be described with reference to FIGS. 4 to 11.

Figure 4:
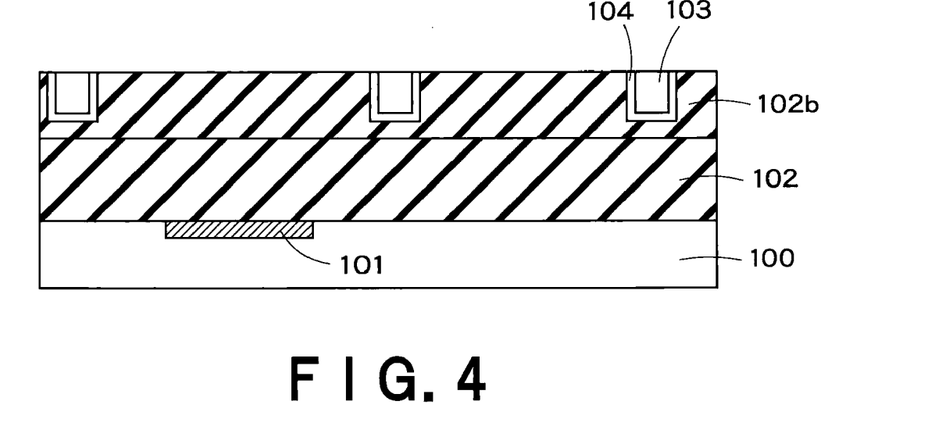
FIG. 4 is a sectional view for explaining a method of manufacturing the semiconductor device according to the above-mentioned embodiment.

As shown in FIG. 4, silicon oxide film 102 having film thickness 500 nm and silicon oxide film 102b having film thickness of 400 nm are formed, by the CVD process, on silicon substrate 100 where photodiodes 101 are formed.

Further, wiring grooves are formed by the photolithography technology to form, by sputtering, barrier metals 104 containing tantalum and tantalum nitride on the wiring grooves and a silicon oxide film 102b. Further, copper is buried by electroplating to planarize the copper by CMP (Chemical-Mechanical Polishing) to form wiring layers 103.

Figure 5:
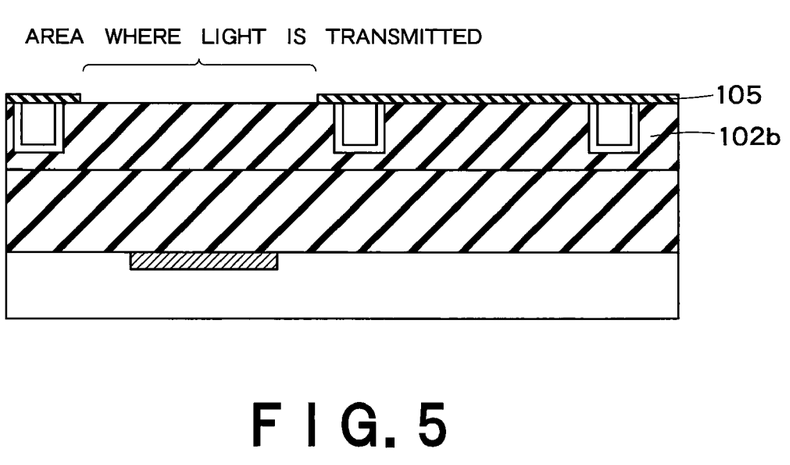
FIG. 5 is a sectional view showing a step subsequent to FIG. 4.

As shown in FIG. 5, silicon nitride film 105 having film thickness of 20 nm serving as diffusion prevention film of copper is formed on the wiring layers 103 and the silicon oxide film 102b by the CVD process. Further, the silicon nitride film 105 of light transmitted part is removed by etching with each wiring layer 103 upper part being left.

Figure 6:
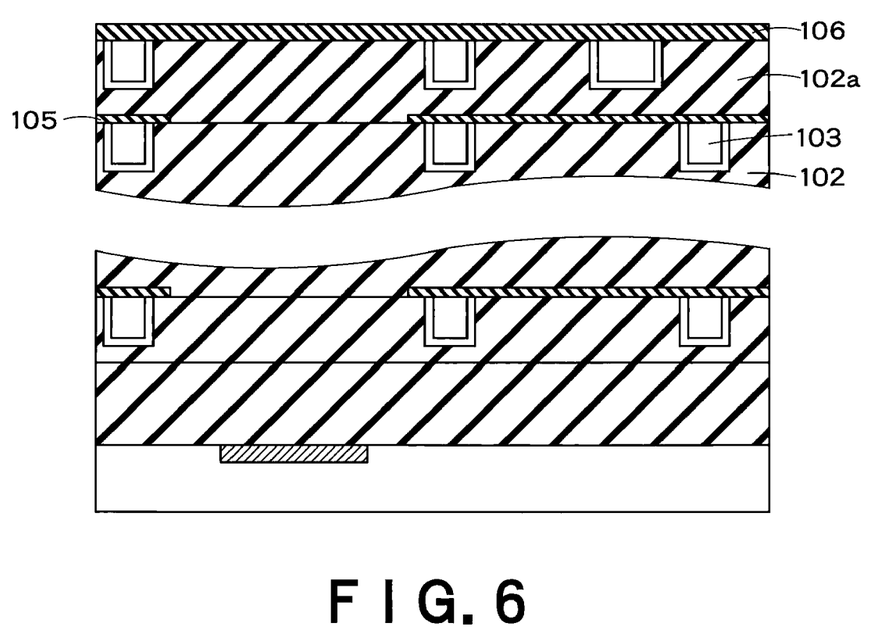
FIG. 6 is a sectional view showing a step subsequent to FIG. 5.

By repeating formation of silicon oxide film, formation of wiring layer and formation/removal of diffusion prevention film, plural layers of insulating films 102 having wiring layers 103 as shown in FIG. 6 are formed. In this case, silicon nitride film 106 on the insulating film (silicon oxide film) 102a of the uppermost layer is not removed by etching.

With respect to the silicon nitride film 106, CVD film using gas of $SiH_4$, $NH_3$ or $N_2$ is used. A technique is employed to increase ratio of $N_2$ as compared to $SiH_4$ or $NH_3$ to deliver power only by HF (High Frequency) power in the atmosphere where temperature is maintained at about 400° C. to form a film to allow the film to be a silicon nitride film in which concentration of Si—H bond is smaller than concentration of N—H bond. For example, concentration of Si—H bond is caused to be 0.5 to 3%, and concentration of N—H bond is caused to be about 1 to 3.5%.

It is not necessarily required that a method of forming silicon nitride film 105 and a method of forming silicon nitride film 106 (processing conditions) are the same.

Figure 7:
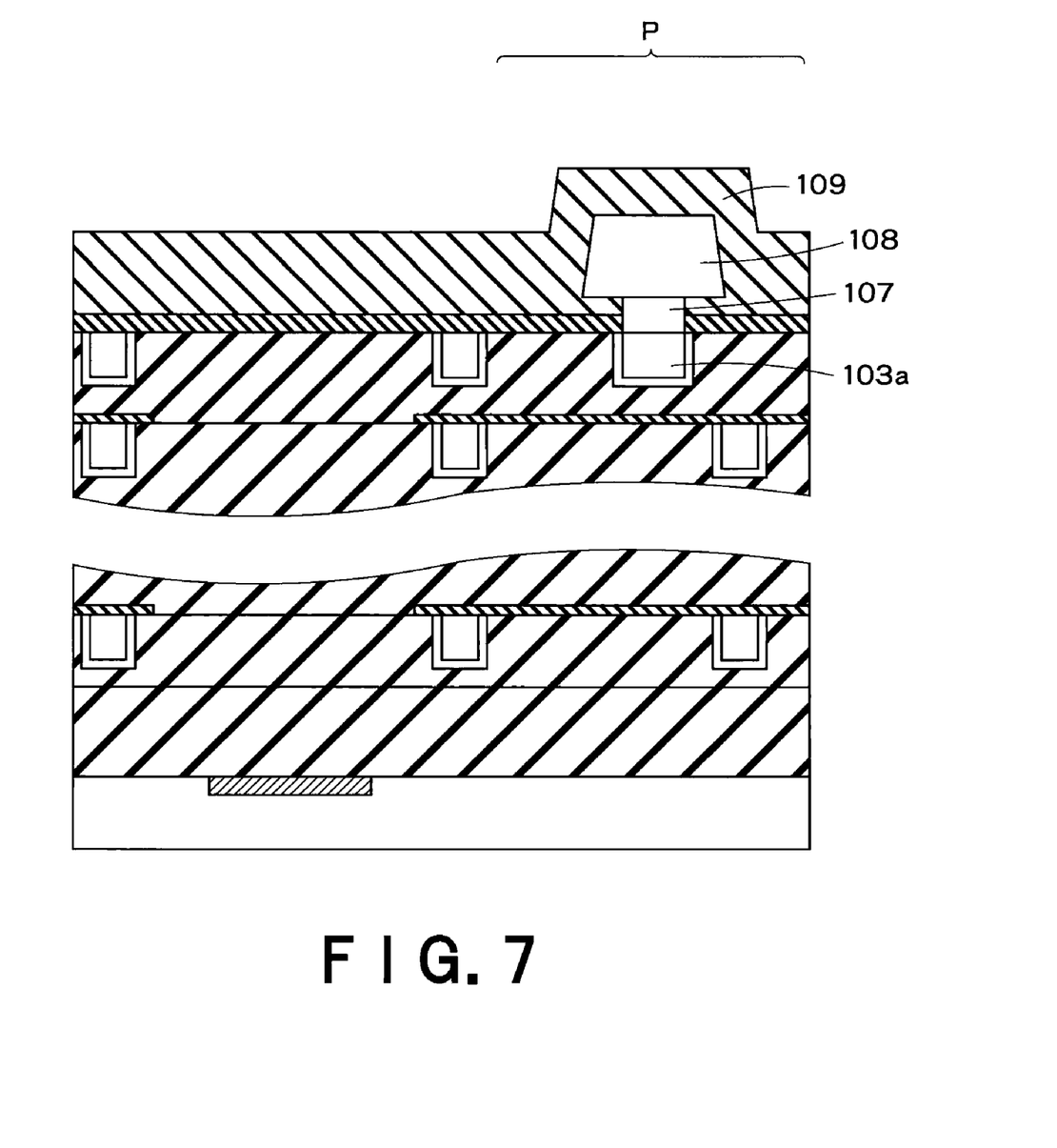
FIG. 7 is a sectional view showing a step subsequent to FIG. 6.

As shown in FIG. 7, contact plug 107 and wiring layer 108 which are connected to the wiring layer 103a of the uppermost layer at the peripheral circuit part P are formed. Further, an interlayer insulating film 109 is formed in a manner to cover contact plug 107 and wiring layer 108.

Figure 8:
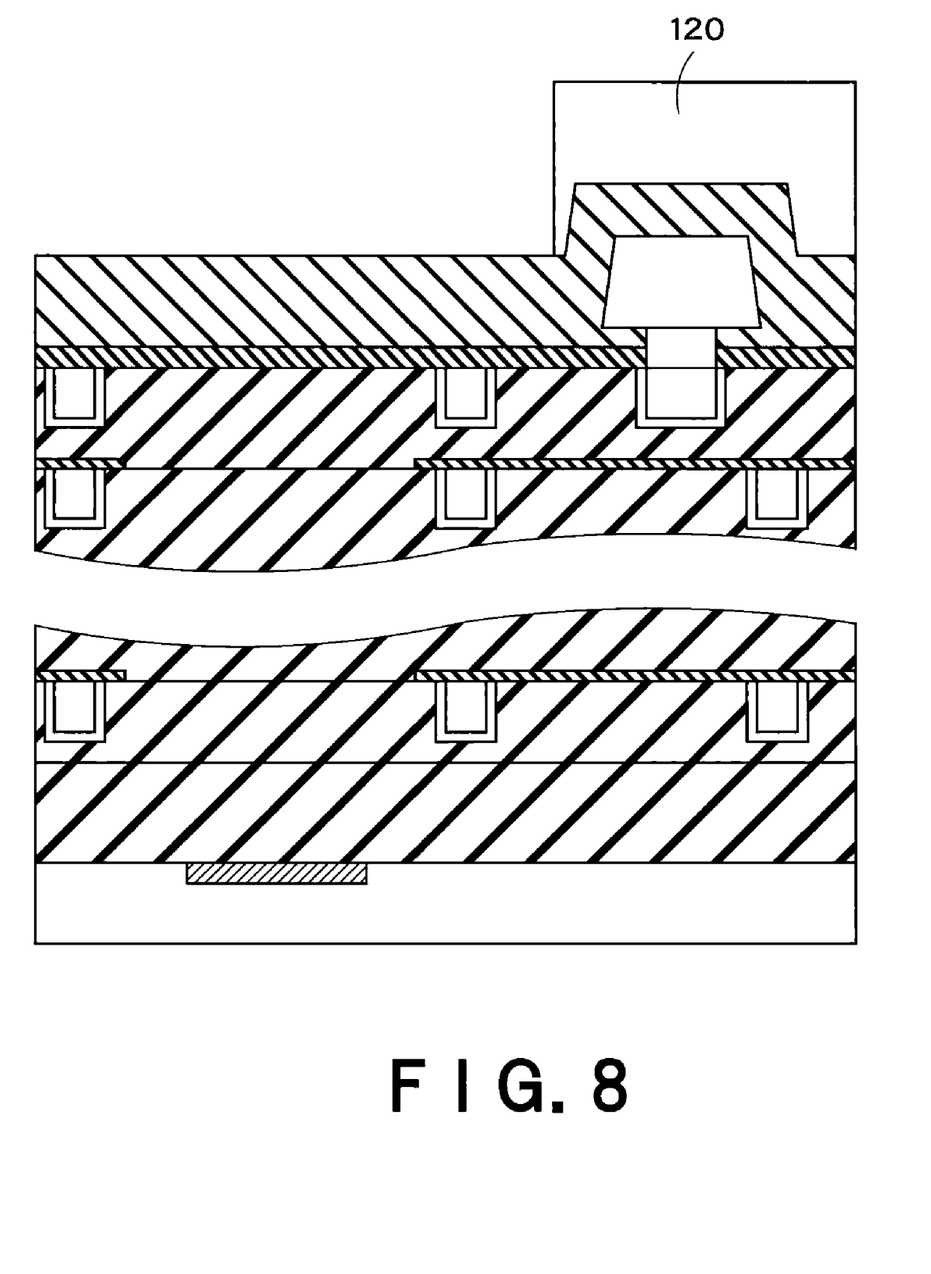
FIG. 8 is a sectional view showing a step subsequent to FIG. 7.

As shown in FIG. 8, a resist 120 is formed at the peripheral circuit part P.

Figure 9:
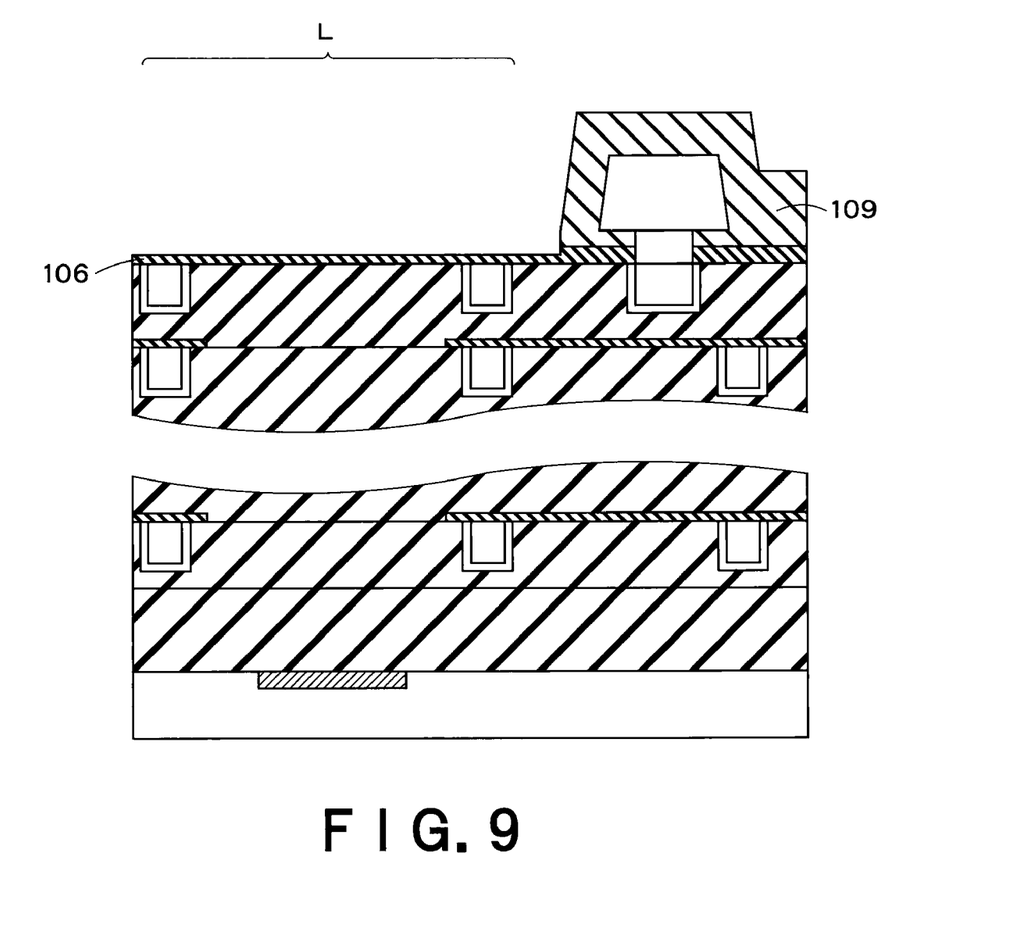
FIG. 9 is a sectional view showing a step subsequent to FIG. 8.

As shown in FIG. 9, the interlayer insulating film 109 of the light receiving area L is removed by etching with the resist 120 being as mask. The silicon nitride film 106 serves as a stopper. After the interlayer insulating film 109 is removed, the resist 120 is removed.

Figure 10:
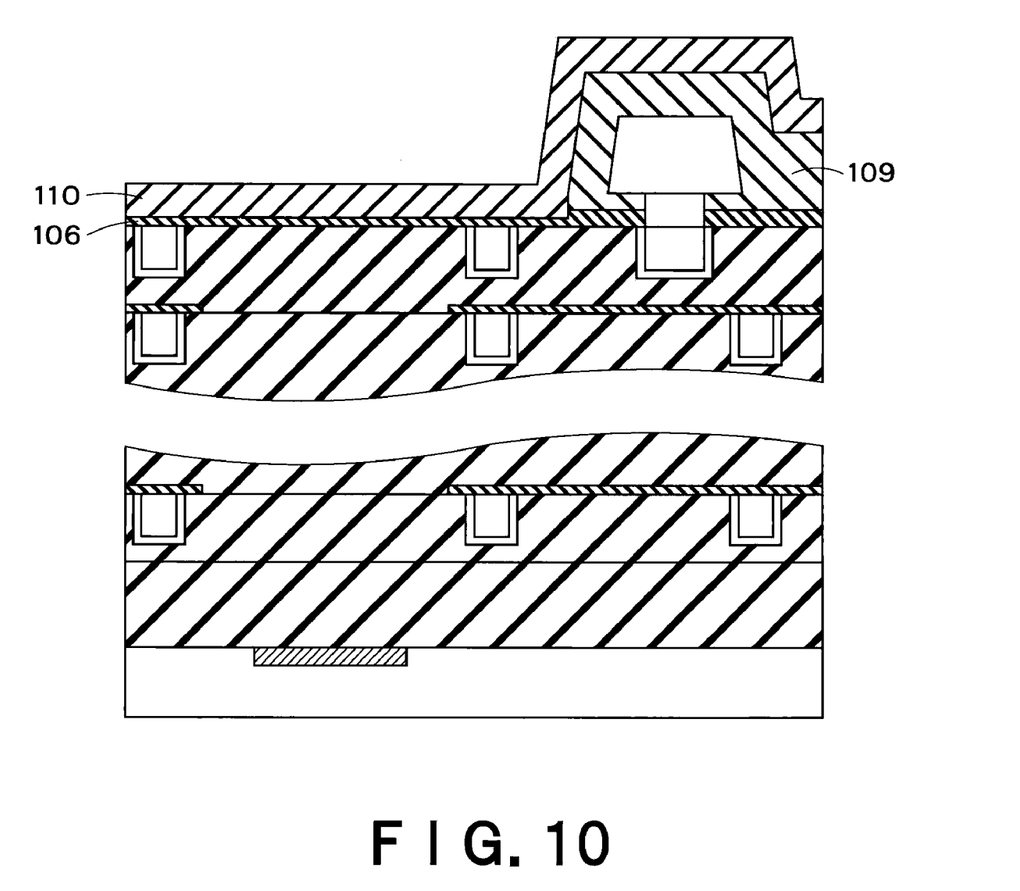
FIG. 10 is a sectional view showing a step subsequent to FIG. 9.

As shown in FIG. 10, silicon nitride film 110 is formed. Also with respect to silicon nitride film 110, similarly to silicon nitride film 106, CVD film using gas of $SiH_4$, $NH_3$ or $N_2$ is used. A technique is employed to increase ratio of $N_2$ as compared to $SiH_4$ or $NH_3$ to deliver power only by HF (High Frequency) power in the atmosphere where temperature is maintained at about 400° C. to form a film to allow the film to be a silicon nitride film in which concentration of Si—H bond is smaller than concentration of N—H bond.

As described above, the total film thickness of the silicon nitride film 106 and the silicon nitride film 110 may be caused to fall within the range from 110 nm to 140 nm.

Figure 11:
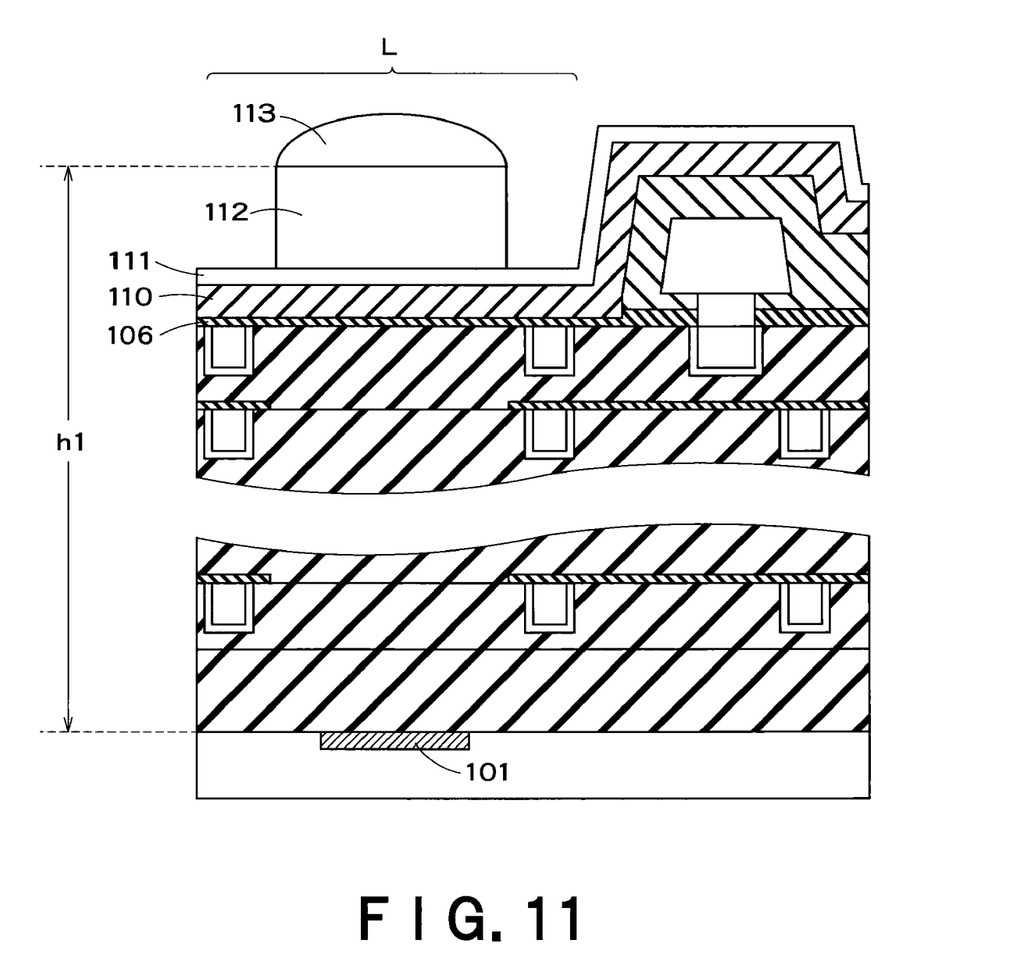
FIG. 11 is a sectional view showing a step subsequent to FIG. 10.

As shown in FIG. 11, a planarization film 111 having film thickness of 250 nm is formed on silicon nitride film 110 by material having, e.g., transmission factor of 95% or more. Further, color filter 112 and microlens 113 are formed on planarization film 111 of light receiving area L.

Since the distance between the microlens 113 and the photodiode 101 (distance h1 in FIG. 11) is shortened, lowering of sensitivity at the photodiode 101 can be suppressed.

Moreover, silicon nitride films 106, 110 having water proof characteristic formed below the color filter 112 and the microlens 113 function as passivation film thus to have ability to improve the reliability.

Further, the silicon nitride films 106, 110 are films in which Si—H concentration is smaller than N—H concentration so that attenuation factor of light is small. Thus, lowering of the sensitivity at the photodiode 101 can be suppressed.

As stated above, it is possible to manufacture a high reliability semiconductor device in which lowering of the sensitivity at the light receiving element 101 is prevented, and passivation films (silicon nitride films 106, 110) are provided below the microlens 113.

Comparative Example

Figure 12:
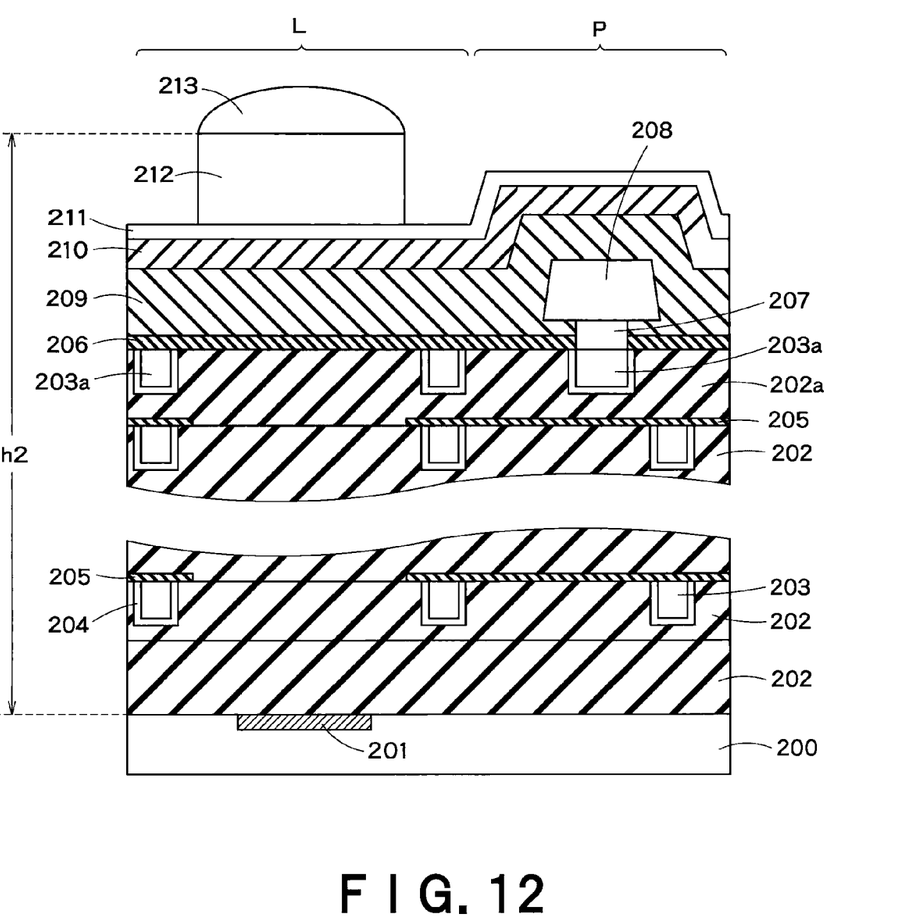
FIG. 12 is a view showing the outline of the configuration of a semiconductor device according to comparative example.

The outline of the configuration of a semiconductor device according to the comparative example is shown in FIG. 12.

On a silicon substrate 200, plural interlayer insulating films 202 are formed. Wiring layers 203 are formed within the interlayer insulating film 202, and barrier metals 204 are formed in a manner to cover the side part and the bottom part of the wiring layer 203. Moreover, diffusion prevention films 205 are formed on the wiring layers 203.

On an interlayer insulating film 202a and wiring layers 203a of the uppermost layer, a silicon nitride film 206 serving as a diffusion prevention film is formed.

At peripheral circuit part P, a wiring layer 208 electrically connected to the wiring layer 203a through a contact plug 207 is formed, and an interlayer insulating film 209 is formed in a manner to cover the silicon nitride film 206 and the wiring layer 208.

A silicon nitride film 210 is formed on the interlayer insulating film 209, and a planarization film 211 is formed on silicon nitride film 210. The planarization film 211 is transparent resin-like substance, and has water permeability. In the light receiving area L, a color filter 212 and a microlens 213 are formed on the planarization film 211.

In the silicon nitride films 210 and 206, Si—H concentration is ordinarily greater than N—H concentration.

In the semiconductor device according to this comparative example, interlayer insulating film 209 is formed below the microlens 213, and distance h2 between the microlens 213 and the light receiving element 201 is long. For this reason, the sensitivity at the light receiving element 201 is lowered.

On the other hand, since the interlayer insulating film 109 of the light receiving area L is removed in the semiconductor device according to the embodiment, the height thereof can be reduced, and lowering of the sensitivity at the light receiving element 101 is suppressed. Moreover, silicon nitride films 110 and 106 such that Si—H concentration is smaller than N—H concentration and light attenuation factor is small are formed below the microlens 113. Accordingly, these films function as passivation film, and lowering of the sensitivity at the light receiving element 101 can be further suppressed.

Figure 13:
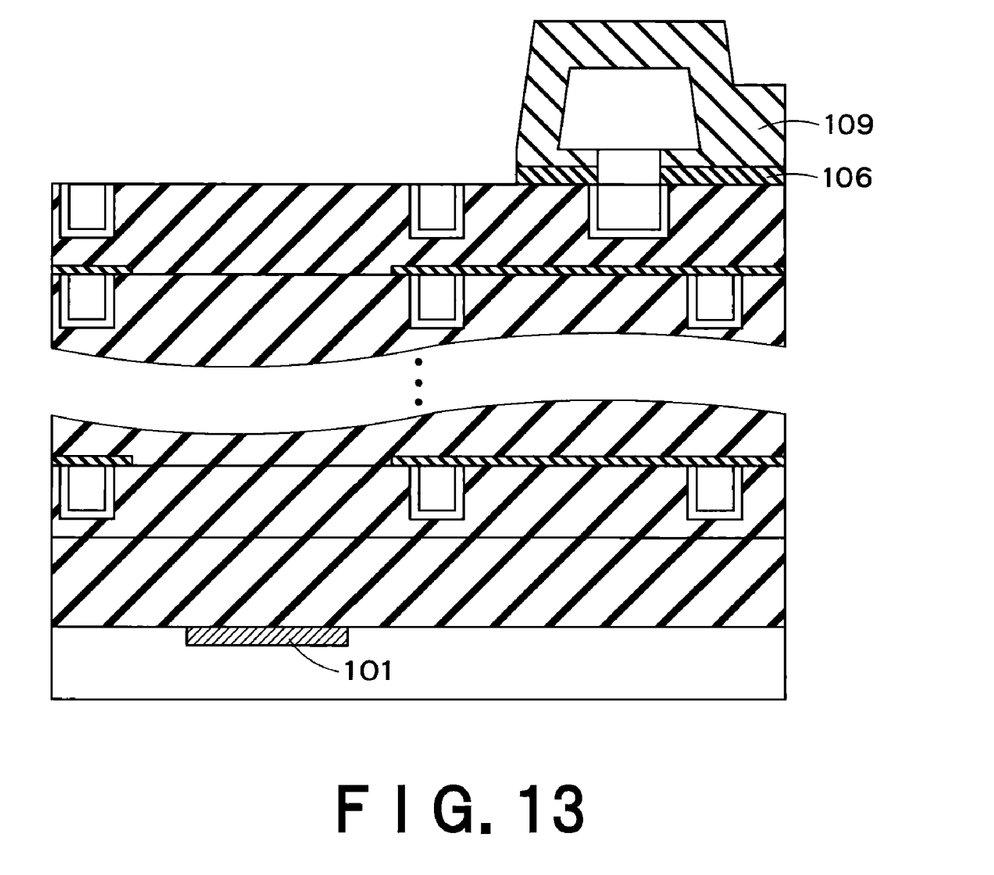
FIG. 13 is a process step cross sectional view for explaining a method of manufacturing a semiconductor device according to a modified embodiment.

While the silicon nitride film 106 is caused to serve as a stopper in etching of the interlayer insulating film 109 as shown in FIG. 9 in the above-described embodiment, the silicon nitride film 106 may be also removed as shown in FIG. 13.

Figure 14:
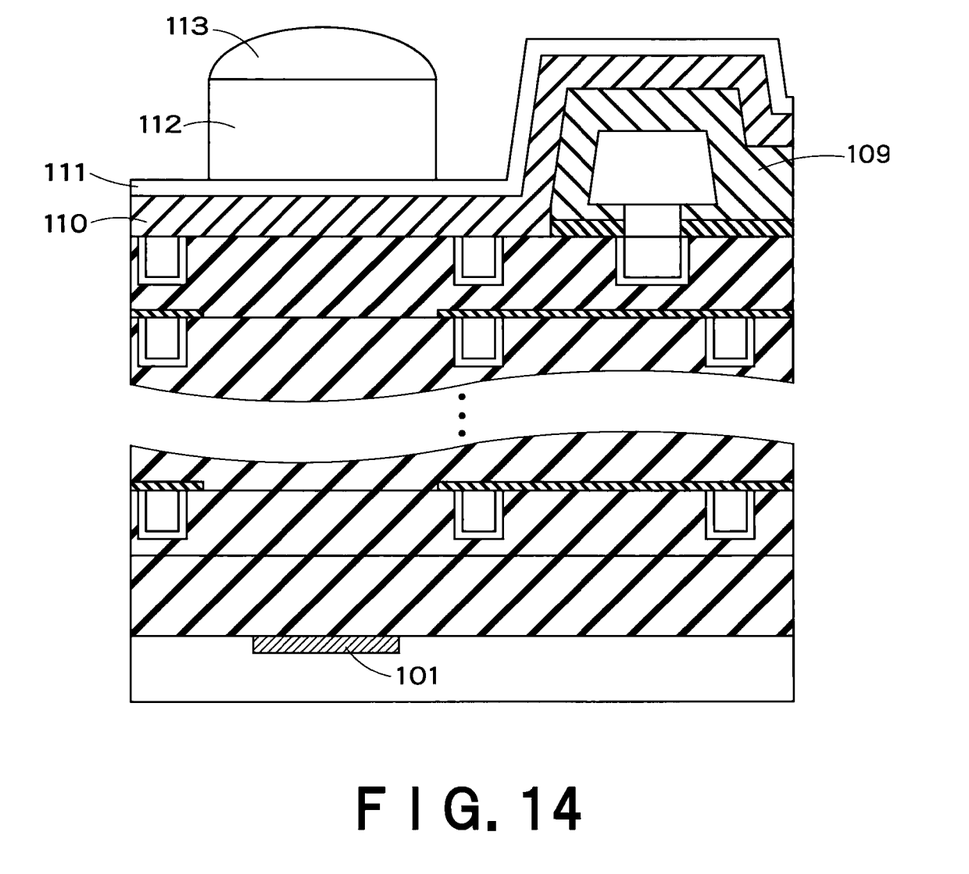
FIG. 14 is a view showing the outline of the configuration of the semiconductor device according to the modified embodiment.

Thereafter, processing similar to process steps shown in FIGS. 10 and 11 is performed. Thus, a semiconductor device as shown in FIG. 14 can be obtained.

Moreover, while removal of diffusion prevention films 105 is carried out every each layer as shown in FIGS. 5 and 6 in the above-described embodiment, there may be employed an approach to collectively remove the diffusion prevention films 105 later without performing such removal processing every each layer to bury insulating film (silicon oxide film) into an opening part formed as the result of removal.

Further, there may be employed an approach in which after the interlayer insulating film 109 shown in FIG. 7 is formed, silicon nitride film is formed on the interlayer insulating film 109 thereafter to form resist at the peripheral circuit part P to remove, by etching, silicon nitride film on interlayer insulating film 109 of the light receiving area L and the interlayer insulating film 109 with this resist being as mask. By adjusting film thickness of silicon nitride film to be formed on the interlayer insulating film 109, it is possible to control film thickness of passivation film formed at the peripheral circuit part P.

In addition, in the semiconductor device according to the embodiments, color filter 112 and microlens 113 are not inevitable. Such semiconductor device can be applied to an image sensor which are not provided with these optical components.

What is claimed is:

1. A method of manufacturing a semiconductor device, comprising:

forming a light receiving element at a surface part of a semiconductor substrate;

forming, on the semiconductor substrate, a plurality of wiring interlayer films each including a wiring layer formed as the result of the fact that copper is buried;

forming, on the wiring interlayer film of the uppermost layer, a first silicon nitride film in which Si—H concentration is smaller than N—H concentration;

forming, at a peripheral circuit part, a contact plug in contact with the wiring layer included in the wiring interlayer film of the uppermost layer, and a wiring in contact with the contact plug;

forming an interlayer insulating film in a manner to cover the wiring;

removing the interlayer insulating film at an upper part of the light receiving element; and forming, at an upper part of the light receiving element, a second silicon nitride film in which Si—H concentration is smaller than N—H concentration.

2. The method of manufacturing semiconductor device according to claim 1, wherein the first silicon nitride film is formed by CVD process using gas in which ratio of $N_2$ is higher than those of $SiN_4$ and $NH_3$.

3. The method of manufacturing semiconductor device according to claim 1, wherein the second silicon nitride film is formed by CVD process using gas in which ratio of $N_2$ is higher than those of $SiH_4$ and $NH_3$.

4. The method of manufacturing semiconductor device according to claim 1, wherein the second silicon nitride film is formed so that total film thickness of the second silicon nitride film and the first silicon nitride film remaining after removing the interlayer insulating film at the upper part of the light receiving element is caused to fall within the range from 110 nm to 140 nm.

5. The method of manufacturing semiconductor device according to claim 1, comprising:

removing the interlayer insulating film at the upper part of the light receiving element thereafter to remove the first silicon nitride film at the upper part of the light receiving element prior to forming the second silicon nitride film; and forming the second silicon nitride film so that film thickness thereof is caused to fall within the range from 110 nm to 140 nm.

6. The method of manufacturing semiconductor device according to claim 1, comprising:

forming the interlayer insulating film in a manner to cover the wiring;

subsequently forming a third silicon nitride film on the interlayer insulating film prior to removing the interlayer insulating film at the upper part of the light receiving element; and removing the third silicon nitride film at the upper part of the light receiving element.

7. The method of manufacturing semiconductor device according to claim 1, comprising:

forming a planarization film on the second silicon nitride film at the upper part of the light receiving element;

forming a color filter on the planarization film; and forming a microlens on the color filter.

* * * * *